Figure 1:
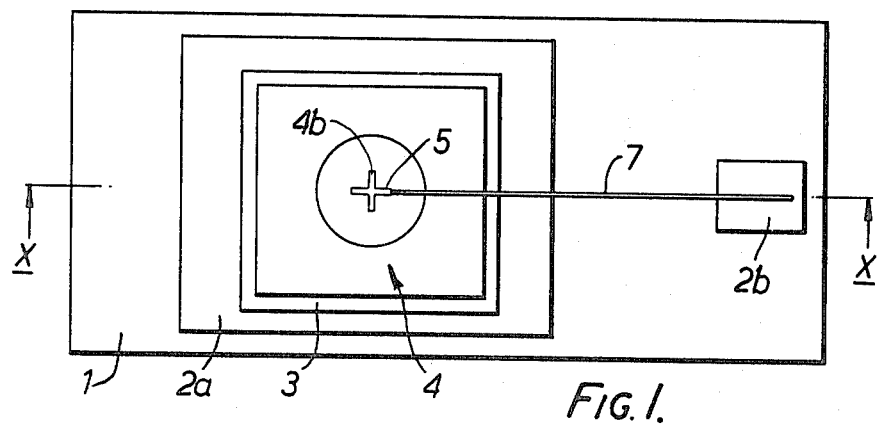

United States Patent [19]

Knibb et al.

[11] 4,224,116

[45] Sep. 23, 1980

[54] DISPLAY DEVICES

[75] Inventors: Terence F. Knibb; Richard G. O'Rourke, both of Northampton, England

[73] Assignee: Plessey Handel und Investments AG, Zug, Switzerland

[21] Appl. No.: 29,878

[22] Filed: Apr. 13, 1979

Related U.S. Application Data

[63] Continuation-in-part of Ser. No. 869,151, Jan. 13, 1978.

[30] Foreign Application Priority Data

Jan. 17, 1977 [GB] United Kingdom ............... 1756/77

[51] Int. Cl.³ .......................... C25D 5/02; C25D 7/06
[52] U.S. Cl. ........................................ 204/15; 204/27
[58] Field of Search ...................... 357/30, 52, 73, 17, 357/18; 362/19; 204/15, 23, 27

[56] References Cited

U.S. PATENT DOCUMENTS

| 3,964,157 | 6/1976 | Kuhn et al. | 29/591 |
| 4,020,336 | 4/1977 | Linder | 362/19 |
| 4,088,546 | 5/1978 | Wu et al. | 204/15 |

FOREIGN PATENT DOCUMENTS 1211663 11/1970 United Kingdom .
1411600 10/1975 United Kingdom .
1472187  5/1977 United Kingdom .

Primary Examiner—T. M. Tufariello
Attorney, Agent, or Firm—Fleit & Jacobson

[57] ABSTRACT

To reduce or eliminate reflections from metallic connections on a light emitting diode chip, a method of making a display device incorporating a light emitting diode chip includes the step of electroplating the metallic parts with a light absorbing material.

17 Claims, 3 Drawing Figures

DISPLAY DEVICES

This is a continuation-in-part of Application Ser. No. 869,151, filed on Jan. 13, 1978.

This invention relates to a method of making display devices and more particularly to a method of making display devices incorporating light emitting diode chips.

It has been found that displays incorporating light emitting diodes suffer from reflections from the metallic connections to the diodes, particularly in very bright conditions such as aircraft cockpits, causing the displays to be difficult to read.

It is an object of the present invention therefore to reduce or overcome this problem.

According to the present invention a method of making a display device comprises the steps of:
forming a plurality of metallic electrical connections on a substrate,
bonding a light emitting diode chip to said substrate,
connecting a number of said plurality of metallic electrical connections to said light emitting diode chip and
electroplating at least some of said metallic electrical connections with a layer of light absorbing material.

Said layer of light absorbing material may comprise substantially pure chromium electroplated in such a manner that the layer produced thereby comprises a plurality of microscopic particles of chromium, said microscopic particles being formed into a sponge-like or honeycomb-like structure whereby it is non-reflective to direct light. This layer appears black to the naked eye and is hereinafter referred to as "black chromium".

Alternatively the layer of light absorbing material may comprise substantially pure platinum electroplated to form a structure similar to that described above. This layer is hereinafter referred to as "black platinum".

Figure 2:
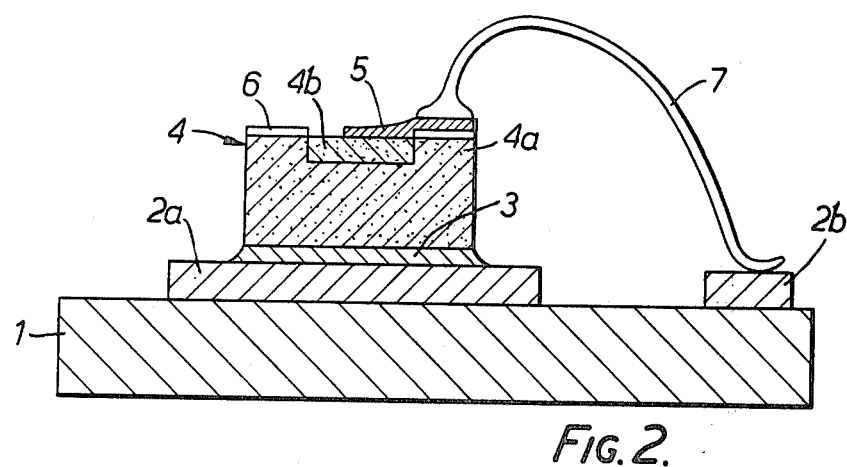
Figure 3:
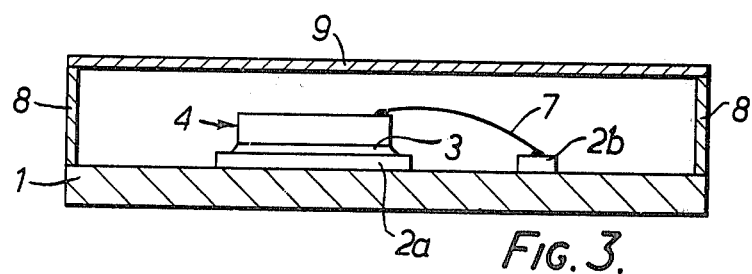

Embodiments of the invention will now be described by way of example only and with reference to the accompanying drawings in which:

FIG. 1 illustrates in plan view a display device made by the method according to the invention, FIG. 2 illustrates in partial cross section taken along X—X the display device of FIG. 1, and FIG. 3 illustrates in cross section a display device as shown in FIGS. 1 and 2 encapsulated by a rigid protective covering.

With reference to FIGS. 1 and 2 of the drawings a display device made by the method according to the invention comprises a substrate 1, for example, made from ceramic, having two metal bonding pads 2a and 2b, secured to the surface of the substrate. These pads are, for example, made from gold deposited by printing a gold-bearing thick film paste on to the substrate and firing this at high temperature (typically around 1000° C.) or made by printing a non-precious metal in the same manner and subsequently electroplating with pure gold, or made by etching selectively a metal layer deposited by vacuum evaporation or sputtering and subsequently electroplating with pure gold.

Secured to the pad 2a by a conductive adhesive 3 (for example, a silver loaded epoxy resin) is a light emitting diode chip 4. The light emitting diode chip is constructed in known manner from an N-type region of material 4a (typically gallium phosphide) and a P-type region 4b (also typically gallium phosphide). An electrode 5 is secured to the p-type region but is insulated from the N-type region 4a by means of a transparent insulating layer 6, for example of silicon nitride. The electrode 5 is also made of gold or a gold rich alloy (e.g. 98% An and 2% Zn) or aluminium or a thin layer of titanium followed by aluminium and is connected to the pad 2b by a goldwire 7.

It will be seen that by applying a potential across the pads 2a and 2b the light emitting diode 4 will be energised and will be illuminated.

In order to improve the efficiency of the light emitting diode 4 it has been found necessary to improve the contrast between the light emanating regions of the diode 4, and the substrate 1, and the electrical connections. Thus the substrate 1 is formed from a black or dark coloured ceramic and the pads 2a, 2b, the electrode 5, the wire 7 and the silver loaded epoxy resin 3 is electroplated with black chromium or black platinum. All the metal parts in this embodiment are gold or gold rich alloys and all these parts are plated with the black chromium or black platinum. However, it may not be necessary to electroplate all the metal parts, in which case these can be made from other metals. Aluminium, for example, cannot be plated with black chromium or black platinum and thus the electrode 5 and the wire 7 can be made of aluminium and will not be plated. Titanium and a combination of aluminium and titanium also cannot be plated and thus those parts which need not be plated can be made from these materials. The non-metallic parts of the display device are also not plated.

The method of producing the display device consists of firstly producing the substrate 1 from a black or dark coloured ceramic, forming the pads 2a, and 2b, for example by depositing by printing a gold bearing thick film pasts on to the substrate and firing at high temperatures. The light emitting chip 4 is then bonded to a connector with an electrically conductive adhesive, such as the silver loaded epoxy resin 3 and the electrode 5 of the light emitting diode chip 4 is electrically connected to the other connector 2b by the goldwire 7.

Where the bonding pad 2b is not electrically accessible by way of the external connections, and pad 2a is so accessible, the electrical potential on these pads is equalised by connecting these together with an aluminium or gold shorting wire (not shown). This is required since during the plating process a potential difference between these areas will result in inadequate coatings on one of the connectors.

The substrate together with all the bonding wires and the light emitting diode chip are now cleaned with a suitable solvent, for example, heated trichloroethylene and areas not required to be plated such as certain portions of the connectors 2a and 2b which will have external electrical connections are coated with a protective substance, such as lacquer.

The display device may at this stage be electroplated with nickel to improve the uniformity of the subsequent plating of black chromium or black platinum.

The black chromium or black platinum is then electroplated on to the display device using a solution containing black chromium or black platinum at a current density in the range 1 to 50 mA/mm$^2$ for a period not exceeding one hour.

The protective substance is now removed by immersion in a suitable solvent such as acetone.

Finally, the aluminium or gold shorting wire is removed, where aluminium is used, this is easily distinguished since it is not plated by the black chromium or the black platinum.

Whilst a display device using only one light emitting diode chip has been described, a number of light emitting diode chips may be employed, each being secured by an electrically conductive adhesive to a metal connector. These may be connected together in series using wires connecting one metal connector to the electrode of the adjacent light emitting diode chip, or in parallel by securing all the chips to single metal connector, again using wires.

If the light emitting diode chips are connected in series, then the metal connectors carrying the chips are connected together with aluminium or gold wires during the electroplating process so that the potentials of the metal connectors are maintained equal.

The display device is protected from damage by encapsulating it as shown in FIG. 3. The encapsulation comprises wall members 8 which can be made from a suitable light absorbing material such as a black or dark coloured ceramic or epoxy resin and a glass or plastic plate 9 secured to the upper edges of the wall members 8. The plate 9 may contain a circular polarizer which further reduces the amount of any light reflected from the display.

What is claimed is:

1. A method of making a display device including the steps of:
    bonding a plurality of metallic electrical connections onto a substrate,
    bonding a light emitting diode chip to said substrate,
    connecting a number of said plurality of metallic electrical connections to said light emitting diode chip, and
    electroplating at least some of said metallic electrical connections with a layer of light absorbing material, each said layer of light absorbing material comprising a metallic material having a black color.

2. A method according to claim 1 wherein a number of said plurality of metallic electrical connections comprises a number of gold connectors.

3. A method according to claim 2 wherein said light emitting diode chip is bonded to one of said number of gold connectors by an electrically conductive adhesive.

4. A method according to claim 3 wherein said electrically conductive adhesive comprises silver loaded epoxy resin.

5. A method according to claim 1 wherein a number of said plurality of metallic electrical connections comprises a number of electrically conductive wires.

6. A method according to claim 5 wherein said number of electrically conductive wires consists of gold.

7. A method according to claim 5 wherein said number of electrically conductive wires consists of aluminium.

8. A method according to claim 5 wherein said number of electrically conductive wires consists of a combination of aluminium and titanium.

9. A method according to claim 1 wherein said layer of light absorbing material comprises black chromium as.

10. A method according to claim 1 wherein said layer of light absorbing material comprises black platinum.

11. A method according to claim 1 wherein said plurality of metallic electrical connections is maintained at the same potential by connecting at least one aluminium wire to said plurality of metallic electrical connections before electroplating said plurality of metallic electrical connections with said layer of light absorbing material and removing said at least one aluminium wire after electroplating.

12. A method according to claim 1 wherein said display device is cleaned in heated trichloroethylene before electroplating with said layer of light absorbing material.

13. A method according to claim 1 wherein selected areas of said plurality of metallic electrical connections are coated with lacquer prior to electroplating with said layer of light absorbing material.

14. A method according to claim 1 wherein said device is electroplated with nickel prior to electroplating with said light absorbing material.

15. A method according to claim 9 wherein said black chromium is electroplated onto the device using a plating solution containing chromium at a current density in the range 1 to 50 $mA/mm^2$ for a period not exceeding one hour.

16. A method according to claim 10 wherein said black platinum is electroplated onto the device using a plating solution containing platinum at a current density in the range 1 to 50 $mA/mm^2$ for a period not exceeding one hour.

17. A method according to claim 13 wherein said lacquer is removed after electroplating with said layer of light absorbing material by immersing said display device in acetone.

* * * * *